(12) United States Patent
Lee et al.

(10) Patent No.: US 10,693,069 B1
(45) Date of Patent: Jun. 23, 2020

(54) METHOD FOR MANUFACTURING ORGANIC SEMICONDUCTOR TRANSISTOR

(71) Applicant: Seoul National University R&DB Foundation, Seoul (KR)

(72) Inventors: Takhee Lee, Seoul (KR); Youngrok Kim, Goyang-si (KR); Keehoon Kang, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 16/457,702

(22) Filed: Jun. 28, 2019

(30) Foreign Application Priority Data

Mar. 29, 2019 (KR) ........................ 10-2019-0037002

(51) Int. Cl.
    *H01L 51/00* (2006.01)
    *H01L 51/05* (2006.01)
    *H01L 51/10* (2006.01)

(52) U.S. Cl.
    CPC ........ *H01L 51/002* (2013.01); *H01L 51/0007* (2013.01); *H01L 51/0017* (2013.01); *H01L 51/0028* (2013.01); *H01L 51/0545* (2013.01); *H01L 51/0566* (2013.01);
    (Continued)

(58) Field of Classification Search
    None
    See application file for complete search history.

(56) References Cited

U.S. PATENT DOCUMENTS

| | | | |
|---|---|---|---|
| 8,614,437 B2 * | 12/2013 | Dimitrakopoulos ... | B82Y 15/00 257/40 |
| 2004/0192042 A1 * | 9/2004 | Sirringhaus ......... | H01L 51/0021 438/689 |

(Continued)

FOREIGN PATENT DOCUMENTS

| | | |
|---|---|---|
| KR | 10-0659103 B1 | 12/2006 |
| KR | 10-0670354 B | 1/2007 |

OTHER PUBLICATIONS

Youngrok Kim et al., Enhanced charge injection properties of organic field effect transistors by doping through solid state diffusion (Conference presentation material), International Conference on Science and Technology of Synthetic Metals, Jul. 1-6, 2018, Bexco, Busan, Republic of Korea.

(Continued)

*Primary Examiner* — Andres Munoz

(57) ABSTRACT

A method of manufacturing an organic semiconductor transistor is provided. The method incudes forming a gate insulating layer on a gate electrode, forming a source electrode and a drain electrode which are spaced apart from each other on the gate insulating layer, forming a channel layer using an organic semiconductor on a gate insulating layer on which the source electrode and the drain electrode are formed, and thermally depositing dopant molecules on the channel layer, wherein, in the thermal deposition of the dopants, the dopant molecules are thermally deposited to be spaced above a position at which each of the source electrode and the drain electrode is in contact with the channel layer, and the dopant molecules and the organic semiconductor form a material combination in which the dopant molecules diffuse in the organic semiconductor in a solid-state diffusion manner.

6 Claims, 13 Drawing Sheets

(52) U.S. Cl.
CPC .......... *H01L 51/105* (2013.01); *H01L 51/005* (2013.01); *H01L 51/0036* (2013.01)

(56) References Cited

U.S. PATENT DOCUMENTS

| | | | | |
|---|---|---|---|---|
| 2005/0263756 A1* | 12/2005 | Yatsunami | ............ | H01L 51/105 257/40 |
| 2006/0006378 A1* | 1/2006 | Hirai | ................... | H01L 51/0508 257/40 |
| 2006/0060834 A1* | 3/2006 | Hirai | ................... | H01L 51/0545 257/40 |

OTHER PUBLICATIONS

Youngrok Kim et al. Enhanced charge injection properties of organic field effect transistors by selective doping through solid-state diffusion (Conference presentation material), The Korean Physical Society, Oct. 24-26, 2018, Changwon, Republic of Korea.

Youngrok Kim et al., Enhanced Charge Injection Properties of Organic Field-Effect Transistor by Molecular Implantation Doping, Jan. 22, 2019, Advanced Materials.

Youngrok Kim et al., Enhanced Charge Injection Properties of Organic Field Effect Transistor via Molecular Implantation Doping (Conference presentation material), Bulletin of the American Physical Society on Mar. 4-8, 2019, Boston, Massachusetts, United States.

Keehoon Kang et al., 2D coherent charge transport in highly ordered conducting polymers doped by solid state diffusion, Nature Materials, vol. 15, May 9, 2016.

* cited by examiner

METHOD FOR MANUFACTURING ORGANIC SEMICONDUCTOR TRANSISTOR

CROSS-REFERENCE TO RELATED APPLICATION(S)

This application claims priority from Korean Patent Application No. 10-2019-0037002, filed on Mar. 29, 2019, in the Korean Intellectual Property Office, the disclosure of which is incorporated herein by reference in its entirety.

BACKGROUND

1. Field

The following description relates to a method for manufacturing a semiconductor, and more particularly, to a method for manufacturing an organic semiconductor transistor.

2. Description of Related Art

Organic semiconductor transistors, which are thin film transistors including channel layers formed of organic semiconductor materials, are attracting attention. Since the organic thin film transistors can be formed to be lightweight and flexible, the organic thin film transistors are expected to be applied to next generation displays which have high impact resistance and portability. The organic thin film transistor can be used as a semiconductor by applying a soluble low-molecular organic semiconductor and a polymer organic semiconductor thereon. Since a large area process can be applied using a printing method, it can be expected that a cost thereof is significantly reduced. Since the organic semiconductor can be formed at a low temperature, the organic semiconductor has an advantage in that a flexible substrate, such as a plastic substrate, can be used.

Such an organic semiconductor transistor includes an organic semiconductor pattern, which forms a channel layer, and a source electrode and a drain electrode which are formed of metals to be connected to the organic semiconductor pattern. However, due to a high contact resistance between the organic semiconductor material and the source electrode and the drain electrode, the performance of an organic electronic element has a limitation. In order to reduce the limitation, there is a method of doping an organic semiconductor region with dopant molecules to reduce a contact resistance so as to reduce the limitation.

However, since, in the conventional doping method of reducing a contact resistance, doping is performed on usually a surface of an upper layer of an organic semiconductor thin film, there is a limitation in that the conventional doping method is used for usually an organic transistor having a top-gate structure in which an organic semiconductor layer is disposed on a substrate and a gate insulator film and a gate electrode are sequentially disposed on the organic semiconductor layer.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The following description relates to a method for manufacturing an organic semiconductor capable of being utilized to improve the performance of a conventional element while a degree of structural freedom of a transistor element, in which doping is applied to reduce a contact resistance between an organic semiconductor and a metal electrode, is maintained.

In one general aspect, a method for manufacturing an organic semiconductor transistor incudes forming a gate insulating layer on a gate electrode, forming a source electrode and a drain electrode which are spaced apart from each other on the gate insulating layer, forming a channel layer using an organic semiconductor on a gate insulating layer on which the source electrode and the drain electrode are formed, and thermally depositing dopant molecules on the channel layer, wherein, in the thermal deposition, the dopant molecules are thermally deposited to be spaced above a position at which each of the source electrode and the drain electrode is in contact with the channel layer, and the dopant molecules and the organic semiconductor form a material combination in which the dopant molecules diffuse in the organic semiconductor in a solid-state diffusion manner.

The organic semiconductor may include poly(2,5-bis(3-hexadecylthiophen-2-yl)thieno[3,2-b]thiophene) (PBTTT), and the dopant molecule may include 2,3,5,6-tetrafluoro-7,7,8,8-tetracyanoquinodimethane (F4-TCNQ)

The method for manufacturing an organic semiconductor transistor may further include forming a self-assembled monolayer (SAM) before the forming of the channel layer.

The forming of the channel layer may include preparing 9 mg/ml of poly(2,5-bis(3-tetradecylthiophen-2-yl)thieno[3,2-b]thiophene) (PBTTT) solution which is a polymer semiconductor material using a solvent of 1,2-dichlorobenzene, heating the PBTTT solution up to 110° C., performing spin coating with a PBTTT film at 1500 rpm for 45 seconds in a glove box with a nitrogen atmosphere, and after the performing of the spin coating, heating the PBTTT film at 180° C. for twenty minutes and slowly cooling the PBTTT film.

In the thermal deposition of the dopants, a dopant molecule of 2,3,5,6-tetrafluoro-7,7,8,8-tetracyanoquinodimethane (F4-TCNQ) may be deposited to have a thickness of 10 nm using a thermal evaporator under conditions ranging from 0.5 to 1.5 Å/s and $10^{-6}$ Torr.

The method for manufacturing an organic semiconductor transistor may further include plasma-etching an upper portion of the channel layer after thermally depositing the dopants.

Figure 1:
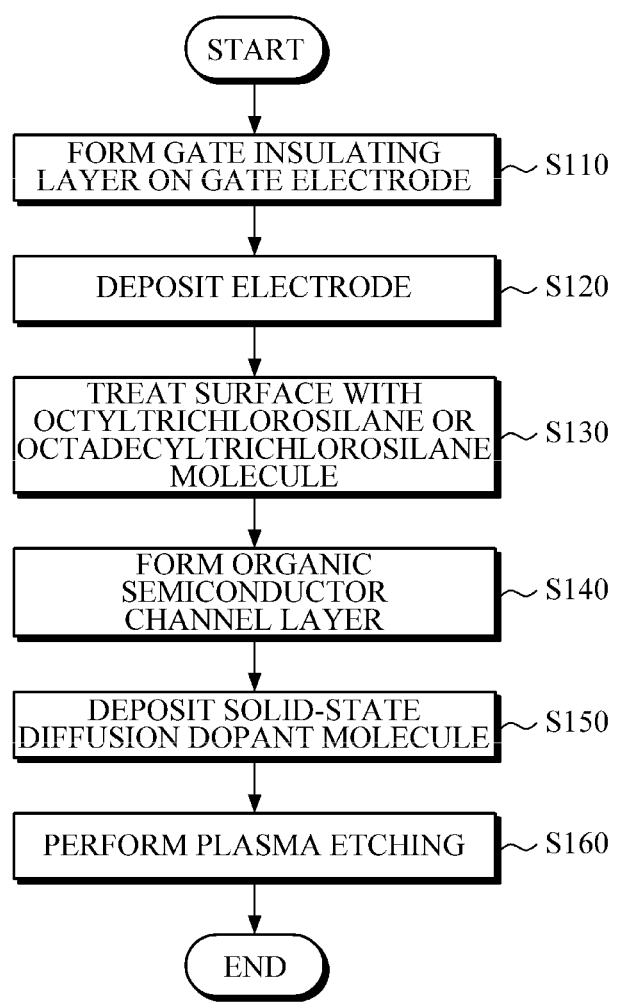
FIG. 1 is a flowchart for describing a method for manufacturing an organic semiconductor transistor according to one embodiment of the present invention.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Details of embodiments are included in detailed descriptions and drawings. Advantages and features of the present invention and methods of achieving the same will be clearly understood with reference to the accompanying drawings and the following detailed embodiments. Like reference numerals denote like elements throughout the description.

While such terms as "first," "second," etc. may be used to describe various components, such components must not be limited to the above terms. The above terms are used only to distinguish one component from another. As used herein, the singular forms "a," "an," and "the" are intended to include the plural forms as well, unless the context clearly indicates otherwise. When a portion "includes" an element, another element may be further included, rather than excluding the existence of another element, unless otherwise described. Moreover, terms described in the description, such as "part" and "module," refer to a unit of processing at least one function or operation and may be implemented by hardware or software or a combination thereof.

Figure 2:
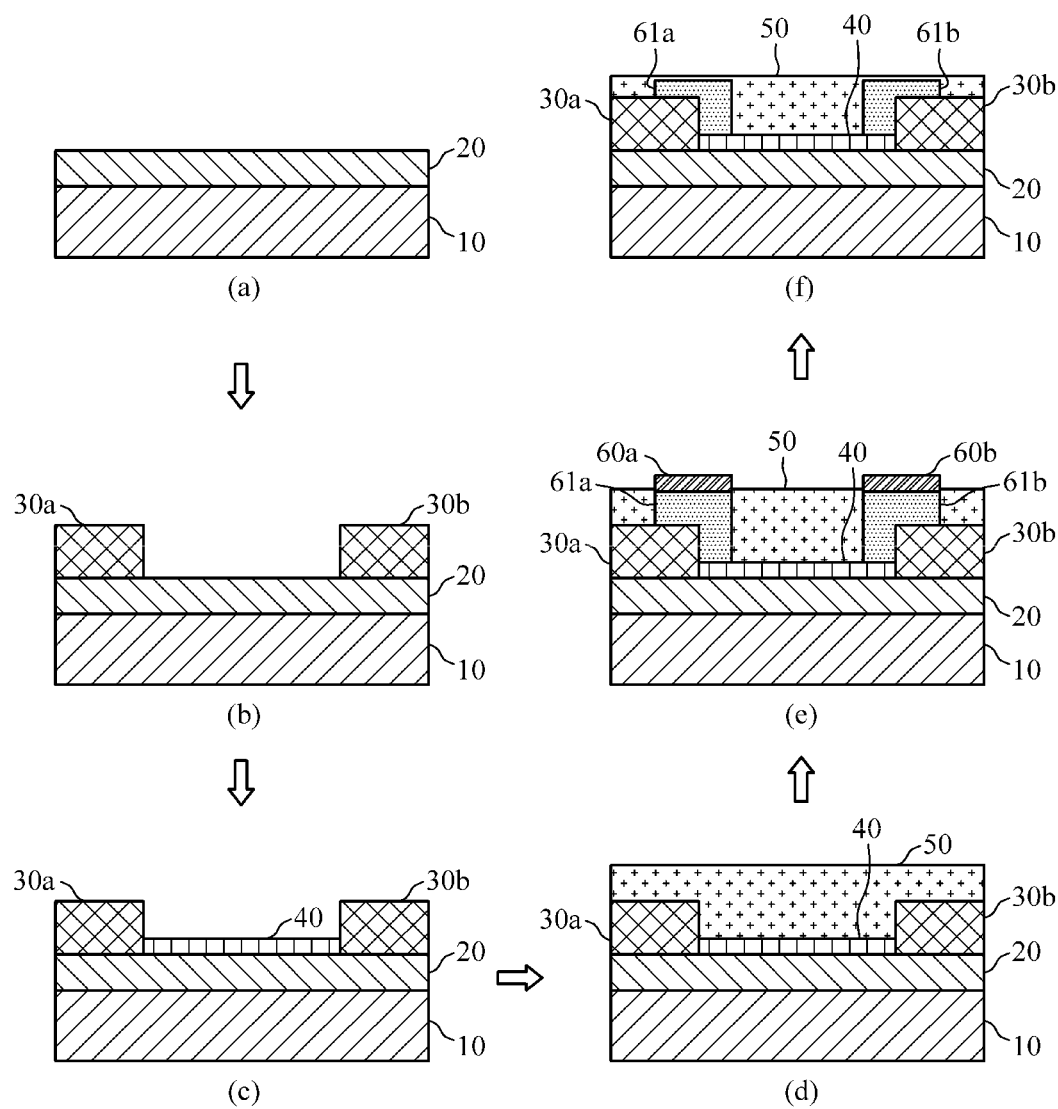
FIG. 2 is a schematic view illustrating an example of a manufacturing process of the organic semiconductor transistor according to one embodiment of the present invention.

FIG. 1 is a flowchart for describing a method for manufacturing an organic semiconductor transistor according to one embodiment of the present invention, and FIG. 2 is a schematic view illustrating an example of a manufacturing process of the organic semiconductor transistor according to one embodiment of the present invention.

Referring to FIG. 1, the method for manufacturing an organic semiconductor transistor according to one aspect of the present invention may include forming a gate insulating layer on a gate electrode (S110), forming a source electrode and a drain electrode which are spaced apart from each other on the gate insulating layer (S120), forming a channel layer using an organic semiconductor on the gate insulating layer on which the source electrode and the drain electrode are formed (S140), and thermally depositing dopant molecules on an upper portion of the channel layer (S150). In addition, a method for manufacturing an organic semiconductor transistor according to another aspect of the present invention may further include forming a self-assembled monolayer (SAM) using at least one of octadecyltrichlorosilane (ODTS) or octyltrichlorosilane (OTS) (S130) before the forming of the channel layer (S140). A method for manufacturing an organic semiconductor transistor according to still another aspect of the present invention may further include plasma-etching an upper portion of the channel layer (S160) after the thermal deposition of the dopants (S150).

Specifically, referring to FIG. 2, as shown in FIG. 2A as the gate electrode 10 is for controlling electrical properties of the channel layer 50, the gate electrode 10 may include a conductive material such as silicon (Si) or a metal. For example, the metal may include at least one among aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re) ruthenium (Ru), tantalum (Ta), tellurium (Te), titanium (Ti), tungsten (W), zinc (Zn), and zirconium (Zr).

The gate insulating layer 20 formed in operation S110 may include an insulating material such as silicon oxide, silicon nitride, or the like.

From a viewpoint of ease of manufacturing, the gate electrode 10 may include silicon (Si), and the gate insulating layer 20 may include silicon oxide (for example, $SiO_2$).

In addition, after the gate insulating layer 20 is grown, a cleaning process is performed. This is for removing foreign matter on a silicon substrate, and for example, the silicon substrate is cleaned for about ten minutes through an ultrasonic method using a cleaning solvent such as deionized water, isopropyl alcohol (IPA), and acetone.

Referring to FIG. 2B, the source electrode 30a and the drain electrode 30b which are spaced apart from each other are formed on the gate insulating layer 20 (S120). According to one embodiment, the source electrode 30a and the drain electrode 30b may be formed of a metal such as Pt, Ru, Au, Ag, Mo, Ti, Al, W, or Cu, a conductive oxide such as InZnO (IZO), AlZnO (AZO), or the like. In addition, according to one embodiment, thicknesses of the electrodes may be changed according to a metal. For example, in the case of titanium (Ti), the thickness may be 2 nm, and in the case of gold (Au), the thickness may be 30 nm. Such a source electrode 30a and a drain electrode 30b may be deposited on a substrate with a shadow mask using a vacuum electron beam evaporator or the like. Here, a pressure of the vacuum electron beam evaporator may be $10^{-7}$ Torr, and a deposition speed thereof may be 0.5 Å/s.

Referring to FIG. 2C, in order to optimize properties of a surface of the substrate, after plasma-etching with $O_2$ (at 50 W and for two minutes) is performed, the substrate is soaked in an octyltrichlorosilane (OTS) 30 mM (anhydrous toluene) solution in a glove box with a nitrogen atmosphere for about twelve hours to form a self-assembled monolayer (SAM) 40 using OTS (S130). The SAM 40 is for improving crystallinity of an organic semiconductor layer, which will be formed later, so as to improve electrical properties of an organic semiconductor thin film. Here, after the substrate on which the OTS is formed is taken out from the glove box in a state in which the substrate is soaked in the anhydrous toluene solution, the substrate is cleaned to remove the remaining OTS molecules. For example, the substrate is cleaned for ten minutes through an ultrasonic method using a cleaning solvent including IPA, acetone, and toluene. After the cleaning, the element is stored in a vacuum environment for about two hours to remove the cleaning solvent.

Next, Referring to FIG. 2D, the channel layer 50 is formed using an organic semiconductor on the substrate on which the source electrode 30a and the drain electrode 30b are formed (S120). Here, according to the present invention, the organic semiconductor has to be formed of a material in which dopant molecules diffuse in the organic semiconductor in a solid-state diffusion manner. According to one embodiment, poly(2,5-bis(3-hexadecylthiophen-2-yl)thieno[3,2-b]thiophene) (PBTTT) may be used as the material of the organic semiconductor. Specifically, 9 mg/ml of poly(2,5-bis(3-tetradecylthiophen-2-yl)thieno[3,2-b]thiophene) (PBTTT) solution which is a polymer semiconductor material is prepared using a solvent of 1,2-dichlorobenzene. Then, the PBTTT solution is heated up to 110° C. to form a uniform PBTTT film before spin coating. Spin-coating is performed with the PBTTT film at 1500 rpm for 45 seconds in the glove box with the nitrogen atmosphere, and the PBTTT film is heated at 180° C. for twenty minutes, and slowly cooled.

Then, as illustrated in FIG. 2E, dopant molecules 60*a* and 60*b* are thermally deposited on the channel layer 50 (S150). That is, the dopant molecules 60*a* and 60*b* are thermally deposited to be spaced above a position at which each of the source electrode 30*a* and the drain electrode 30*b* is in contact with the channel layer 50. According to the present invention, the dopant molecules 60*a* and 60*b* have to be formed of a material which diffuses in the organic semiconductor channel layer 50 in a solid-state diffusion manner. According to one embodiment, 2,3,5,6-tetrafluoro-7,7,8,8-tetracyanoquinodimethane (F4-TCNQ) may be used as a dopant material. According to one embodiment, the dopant molecules 60*a* and 60*b* are deposited on selected regions of an upper surface of the channel layer 50 to have a thickness of 10 nm using a thermal evaporator under conditions ranging from 0.5 to 1.5 Å/s and $10^{-6}$ Torr. Then, the dopant molecules 60*a* and 60*b* diffuse in the channel layer 50, and thus the diffusion injection portions 61*a* and 61*b* are formed to extend to regions in contact with the source electrode 30*a* and the drain electrode 30*b*. Accordingly, charge injection from the electrodes into contact portions between the source electrode 30*a*, the drain electrode 30*b*, and the channel layer 50 formed of the organic semiconductor is improved, and thus a contact resistance can be reduced.

As described above, in a case in which a combination of the organic semiconductor capable of solid-state diffusion and the dopant molecules is used, even when a dopant is deposited on an upper surface of the organic semiconductor channel layer 50, the dopant diffuses to a lower surface of the channel layer 50, and thus there is an advantage in that the present invention can be applied when a structure of the transistor is a bottom-gate structure. Accordingly, there is an advantage in that a dielectric layer of the transistor may be freely selected without degrading properties of the organic semiconductor channel layer 50 unlike a conventional top-gate transistor.

In addition, as illustrated in FIG. 2F, an upper surface of the channel layer 50 may be plasma-etched (S160). This is for preventing stability degradation of a transistor element due to diffusion of dopant molecules. According to one embodiment, just after doping, the upper surface of the channel layer 50 is quickly plasma-etched with Ar (at 50 W and for one second).

Properties of the organic semiconductor transistor manufactured according to the above-described present invention will be described with reference to FIGS. 3A to 7B.

Figure 3A:
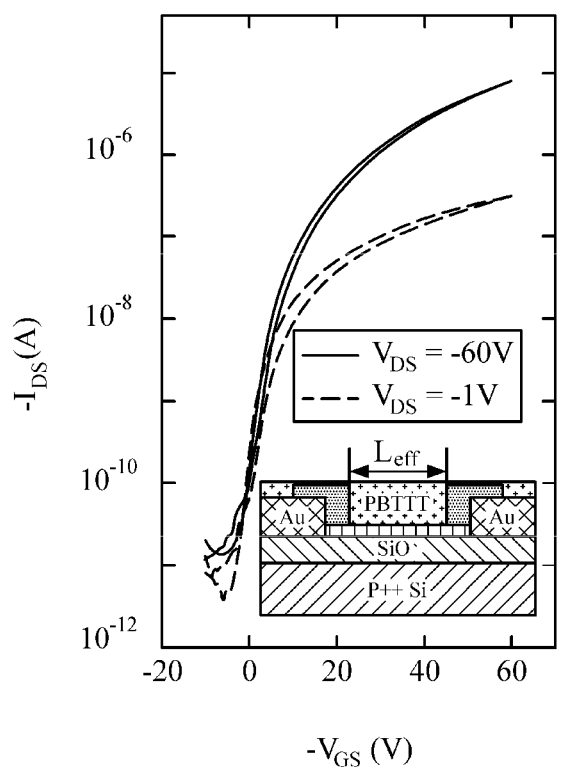
FIG. 3A is a graph showing an Ids-Vgs transfer curve of the organic semiconductor transistor manufactured according to the present invention.
Figure 3B:
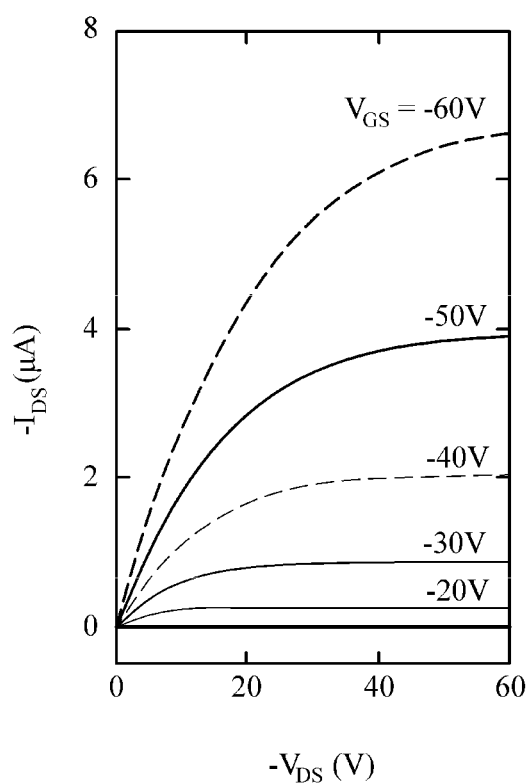
FIG. 3B is a graph showing an Ids-Vds output curve of the organic semiconductor transistor manufactured according to the present invention.

FIG. 3A is a graph showing an Ids-Vgs transfer curve of the organic semiconductor transistor manufactured according to the present invention, and FIG. 3B is a graph showing an Ids-Vds output curve of the organic semiconductor transistor manufactured according to the present invention.

Figure 4A:
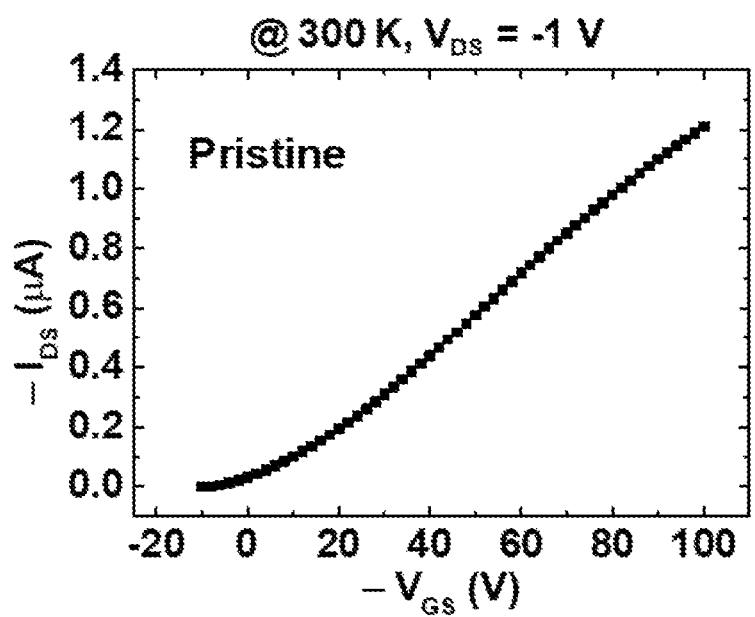
FIGS. 4A to 4C are graphs showing data of an organic semiconductor transistor, which is a comparison target, on the basis of a Y-function method.
Figure 4B:
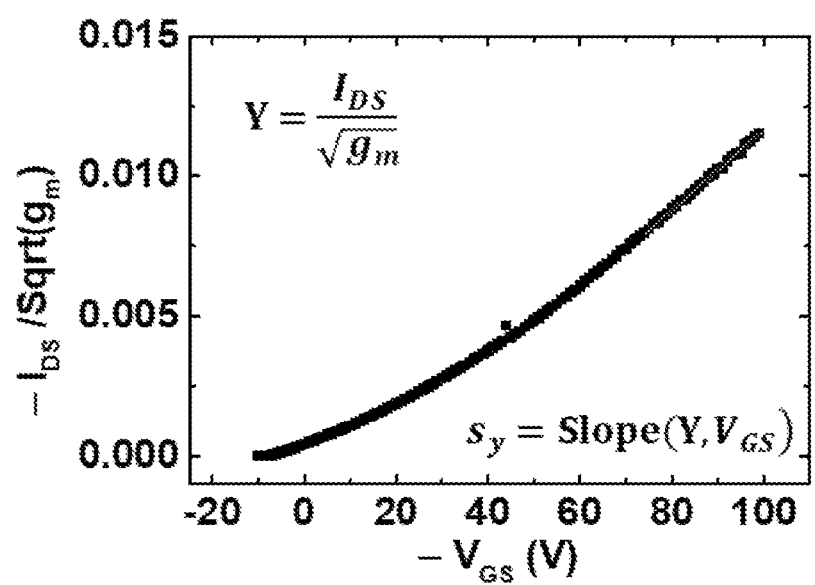
Figure 4C:
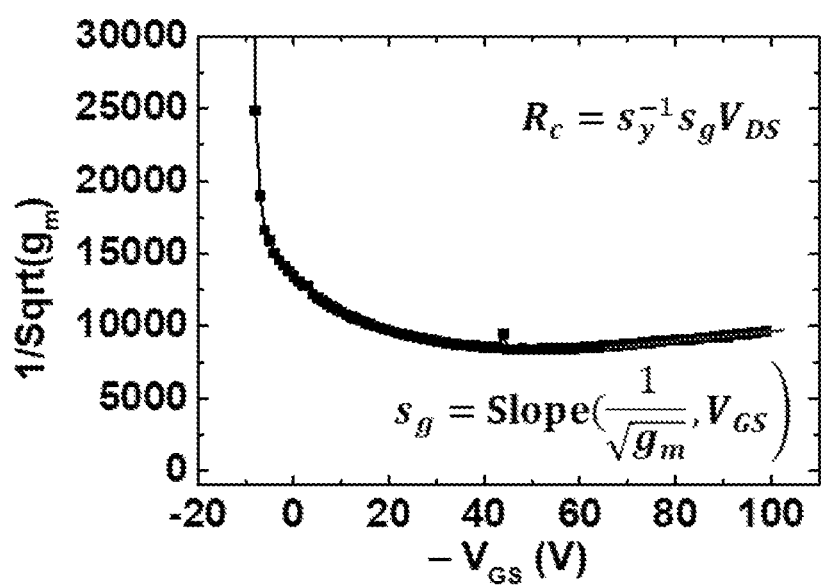
Figure 5A:
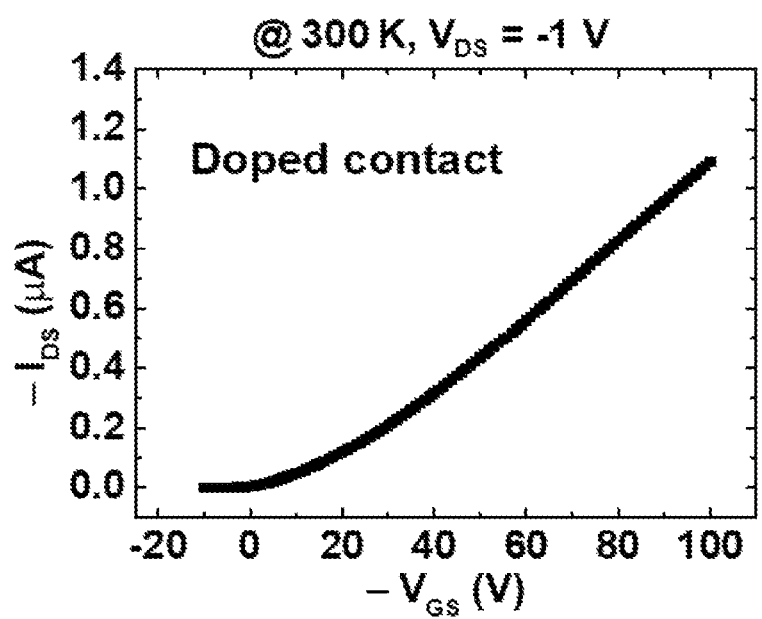
FIGS. 5A to 5C are graphs showing data of the organic semiconductor transistor according to the present invention on the basis of the Y-function method.
Figure 5B:
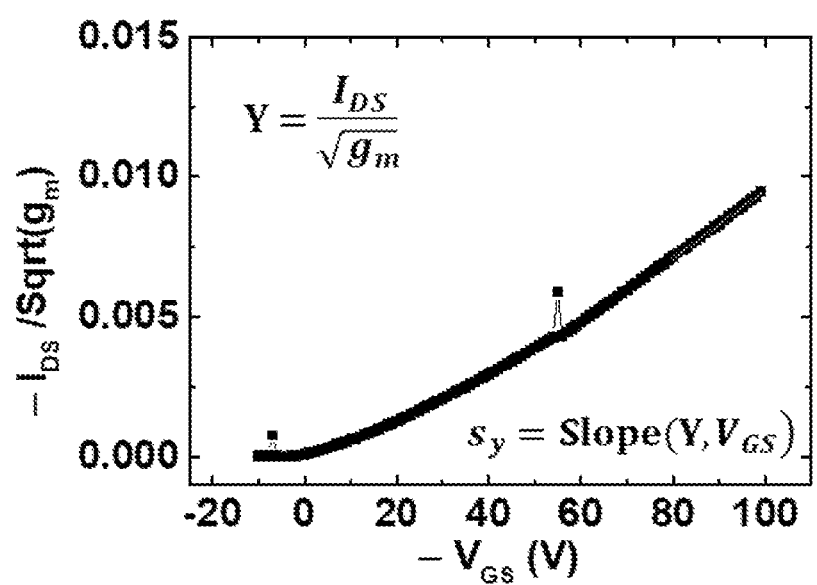
Figure 5C:
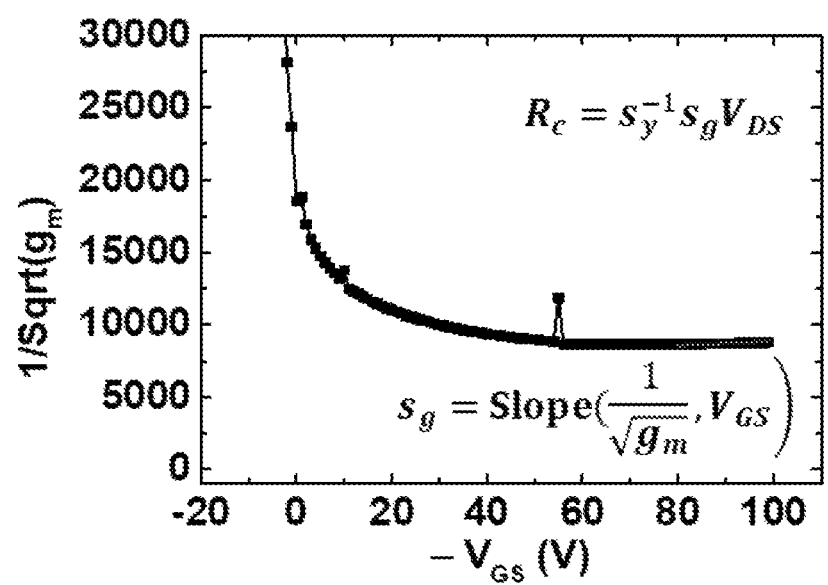

FIGS. 4A to 4C are graphs showing data of an organic semiconductor transistor, which is a comparison target, on the basis of a Y-function method, and FIGS. 5A to 5C are graphs showing data of the organic semiconductor transistor according to the present invention on the basis of the Y-function method.

When FIGS. 4A to 4C are compared to FIGS. 5A to 5C, the contact resistance of the organic semiconductor transistor on which doping is performed according to the present invention is clearly reduced when compared to a comparison target element. That is, a contact resistance of the element extracted using the Y-function method is 24.5 kΩ·cm in the case of the comparison target on which the doping is not performed and the contact resistance of the organic semiconductor transistor on which the doping is performed is 5.1 kΩ·cm.

Figure 6:
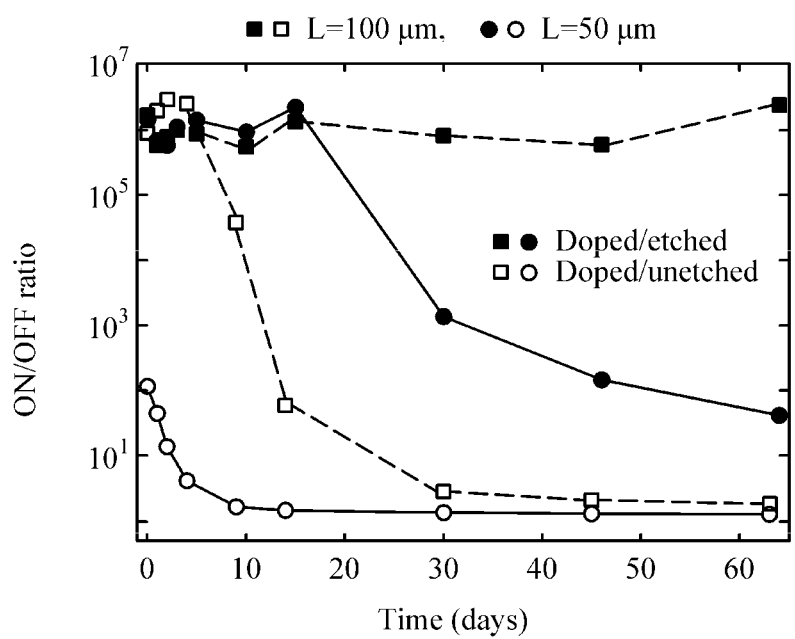
FIG. 6 is a graph showing a variation of an ON/OFF ratio of a transistor according to whether etching is performed after doping during manufacturing of the organic semiconductor transistor according to the present invention.

FIG. 6 is a graph showing a variation of an ON/OFF ratio of a transistor according to whether etching is performed after doping during manufacturing of the organic semiconductor transistor according to the present invention.

Referring to FIG. 6, in the case of an element on which etching is not performed, it may be confirmed that the ON/OFF ratio of the transistor is sharply decreased. That is, it may be seen that plasma etching affects stability of the element during a manufacturing process.

Meanwhile, the contact resistance of the element, which is reduced using the doping, is more clearly effective on a low power element. To this end, the effect was checked using a transistor manufactured to include an insulator formed of $Al_2O_3$, which is a kind of a high-k material using atomic layer deposition (ALD).

Figure 7A:
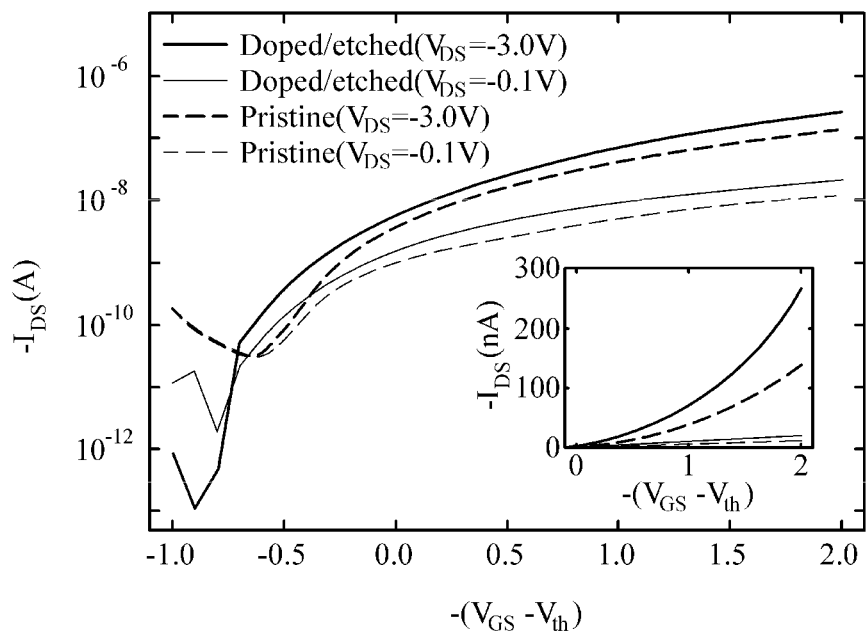
FIG. 7A is a graph showing Ids-Vgs transfer curves of a comparison target element and the organic semiconductor transistor according to the present invention in transistors including a high-k material as a gate insulating layer.
Figure 7B:
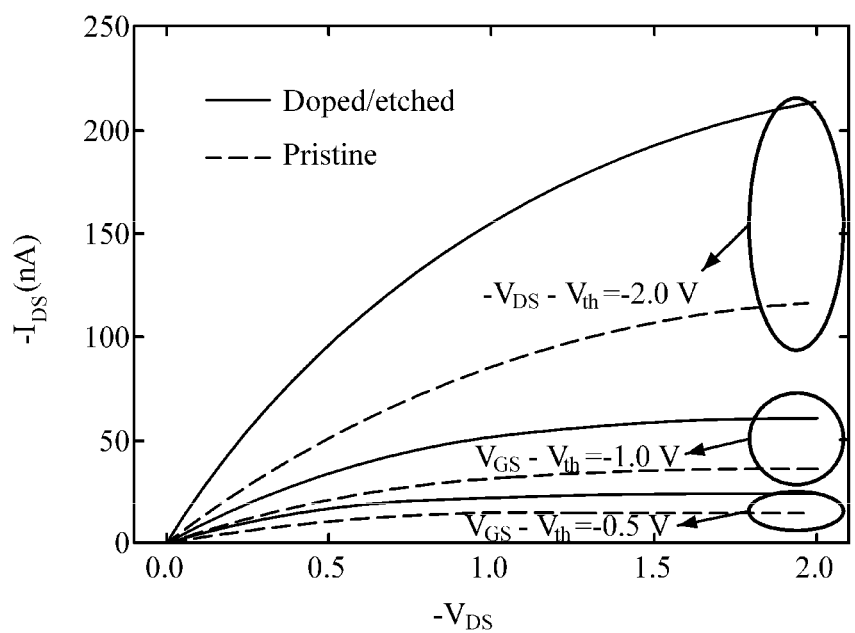
FIG. 7B is a graph showing Ids-Vds transfer curves of the transistor of the comparison target element and the organic semiconductor transistor according to the present invention in the transistors including the high-k material as a gate insulating layer.

FIG. 7A is a graph showing Ids-Vgs transfer curves of a comparison target element and the organic semiconductor transistor according to the present invention in transistors including a high-k material, and FIG. 7B is a graph showing Ids-Vds transfer curves of the comparison target element and the organic semiconductor transistor according to the present invention in the transistors including the high-k material.

Referring to FIGS. 7A and 7B, in a case in which an element having a low operating voltage is formed, while a mobility of the comparison target element is 0.019 cm2/V·s, a mobility of the doped element is 0.037 cm2/V·s. It may be confirmed that the doped element shows a high performance at a low voltage operation due to the reduction in the contact resistance.

According to one embodiment, the present invention maintains a degree of structural freedom of the organic transistor element and is used to improve performance of a conventional element by applying a doping technology based on solid-state diffusion of an organic semiconductor for reducing a contact resistance. Accordingly, a lower power organic electronic element can be realized.

Meanwhile, the present embodiments may be realized with computer readable codes in a computer readable recording medium. The computer readable recording medium includes any kind of a recording device in which computer readable data are stored.

Examples of the computer readable recording medium are a read only memory (ROM), a random-access memory (RAM), a compact disc (CD)-ROM, a magnetic tape, a floppy disk, and an optical data storage device, and the computer readable recording medium may be implemented in a carrier wave type (for example, recorded by transmission through Internet). In addition, the computer readable recording media may be dispersed on computer systems connected through networks, and the computer readable codes may be stored and executed therein in a distributed manner. In addition, functional programs, codes, and segments for realizing the present embodiments may be easily inferred by programmers skilled in the art of the present invention.

It will be understood by those skilled in the art that the invention may be performed in other concrete forms without changing the technological scope and essential features.

Therefore, the above-described examples should be considered in a descriptive sense only and not for purposes of limitation.

What is claimed is:

1. A method for manufacturing an organic semiconductor transistor, comprising:
   forming a gate insulating layer on a gate electrode;
   forming a source electrode and a drain electrode which are spaced apart from each other on the gate insulating layer;
   forming a channel layer using an organic semiconductor on the gate insulating layer on which the source electrode and the drain electrode are formed; and
   thermally depositing dopant molecules on the channel layer,
   wherein, in the thermal deposition of the dopant molecules, the dopant molecules are thermally deposited to be spaced above a position at which each of the source electrode and the drain electrode is in contact with the channel layer, and
   the dopant molecules and the organic semiconductor form a material combination in which the dopant molecules diffuse in the organic semiconductor in a solid-state diffusion manner.

2. The method of claim 1, wherein:
   the organic semiconductor includes poly(2,5-bis(3-hexadecylthiophen-2-yl)thieno[3,2-b]thiophene) (PBTTT); and
   the dopant molecules include 2,3,5,6-tetrafluoro-7,7,8,8-tetracyanoquinodimethane (F4-TCNQ).

3. The method of claim 1, further comprising forming a self-assembled monolayer (SAM) before the forming of the channel layer.

4. The method of claim 1, further comprising plasma-etching an upper portion of the channel layer after the thermal deposition of the dopant molecules.

5. The method of claim 1, wherein the forming of the channel layer includes:
   preparing 9 mg/ml of a poly(2,5-bis(3-tetradecylthiophen-2-yl)thieno[3,2-b]thiophene) (PBTTT) solution, which is a polymer semiconductor material, using a solvent of 1,2-dichlorobenzene;
   heating the PBTTT solution up to 110° C.;
   performing spin-coating of a PBTTT film at 1500 rpm for 45 seconds in a glove box with a nitrogen atmosphere; and
   after the performing of the spin coating, heating the PBTTT film at 180° C. for twenty minutes and cooling the PBTTT film.

6. The method of claim 1, wherein, in the thermal deposition of the dopant molecules, a dopant molecule of 2,3,5,6-tetrafluoro-7,7,8,8-tetracyanoquinodimethane (F4-TCNQ) is deposited to have a thickness of 10 nm using a thermal evaporator under conditions ranging from 0.5 to 1.5 Å/s and $10^{-6}$ Torr.

* * * * *